United States Patent [19]

Young et al.

[11] Patent Number: 4,818,838
[45] Date of Patent: Apr. 4, 1989

[54] APPARATUS FOR PRESELECTING AND MAINTAINING A FIXED GAP BETWEEN A WORKPIECE AND A VACUUM SEAL APPARATUS IN PARTICLE BEAM LITHOGRAPHY SYSTEMS

[75] Inventors: Lydia J. Young, Palo Alto; Lee H. Veneklasen, Castro Valley, both of Calif.

[73] Assignee: The Perkin-Elmer Corporation, Norwalk, Conn.

[21] Appl. No.: 141,812

[22] Filed: Jan. 11, 1988

[51] Int. Cl.⁴ .................................... B23K 15/00
[52] U.S. Cl. .................... 219/121.12; 219/121.21; 219/121.22; 219/121.31; 219/121.33; 250/441.1
[58] Field of Search .............. 219/121.22, 121.12, 219/121.31, 121.32, 121.33, 121.35, 121.84, 121.82; 250/441.1, 440.1

[56] References Cited

U.S. PATENT DOCUMENTS 4,584,479  4/1986  Lamattina et al. ............ 250/441.1
4,607,167  8/1986  Petric ...................... 250/441.1 X

*Primary Examiner*—C. L. Albritton
*Attorney, Agent, or Firm*—Thomas P. Murphy; Edwin T. Grimes; Francis L. Masselle

[57] ABSTRACT

Disclosed is a particle beam lithography system (10) having a workpiece loading/unloading position to one side of a particle beam (32) and beam column (12) where a workpiece (14), to be processed, is placed in a vacuum chuck (100) to eliminate any irregularity or warpage of the workpiece (14). At this same position, the workpiece (14) is oriented and fixed at a preselected distance from a standard by gap setting means (162, 162b). This distance correlates with a preselected gap (G) between a seal apparatus (16) and the workpiece (14) during workpiece processing. The workpiece (14) and chuck (100) are then moved beneath the seal apparatus (16) and beam column (12) for workpiece processing. After processing, the workpiece (14) and chuck (100) are returned to the loading/unloading position to be removed from the lithography system (10). An interface plate (64) is moved from the loading/unloading position to the workpiece processing position by an X-Y stage (50) and a workpiece transport system (130) is provided to transport the workpieces (14) to and from the lithography system (10) to appropriate cassettes (132,134).

14 Claims, 5 Drawing Sheets

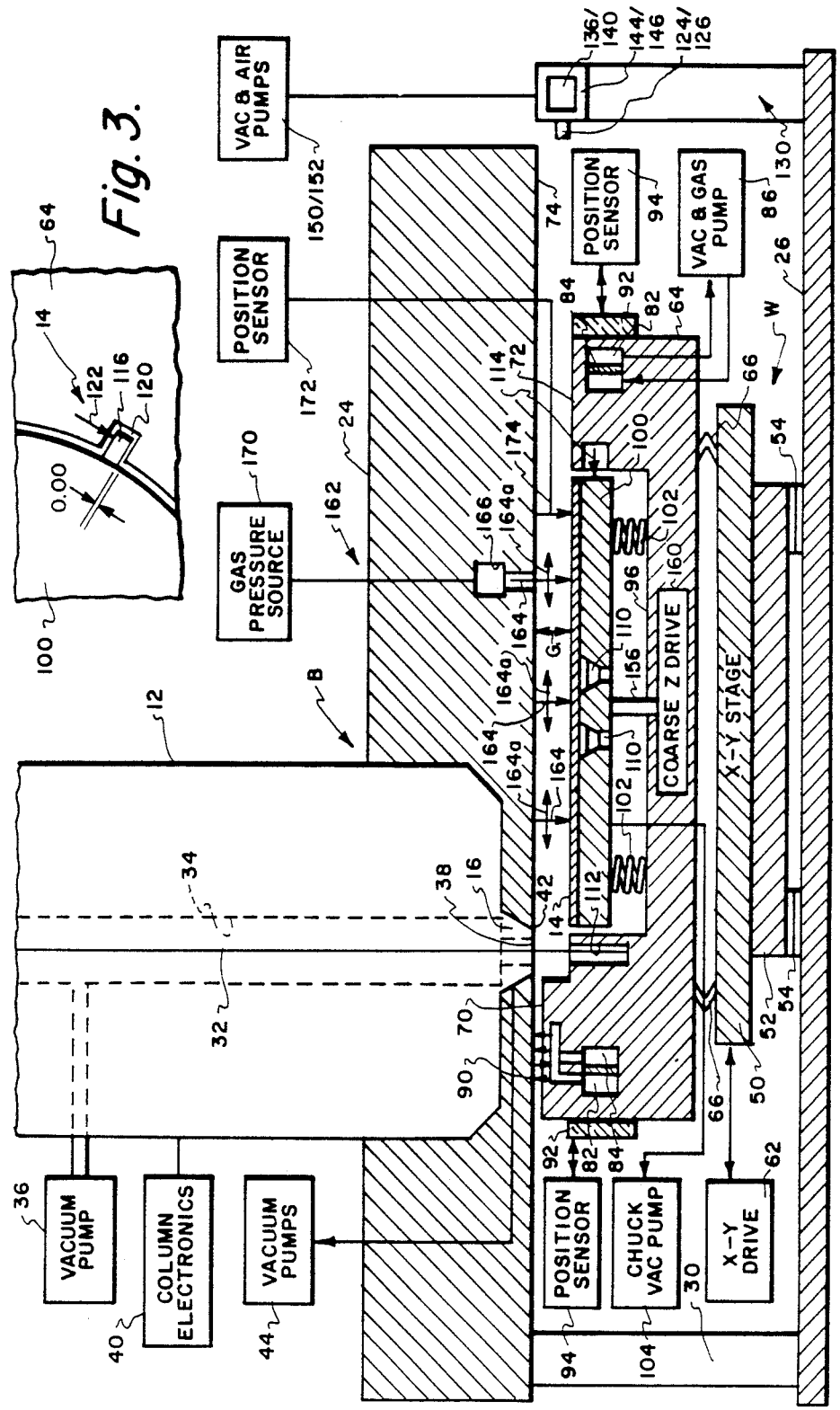

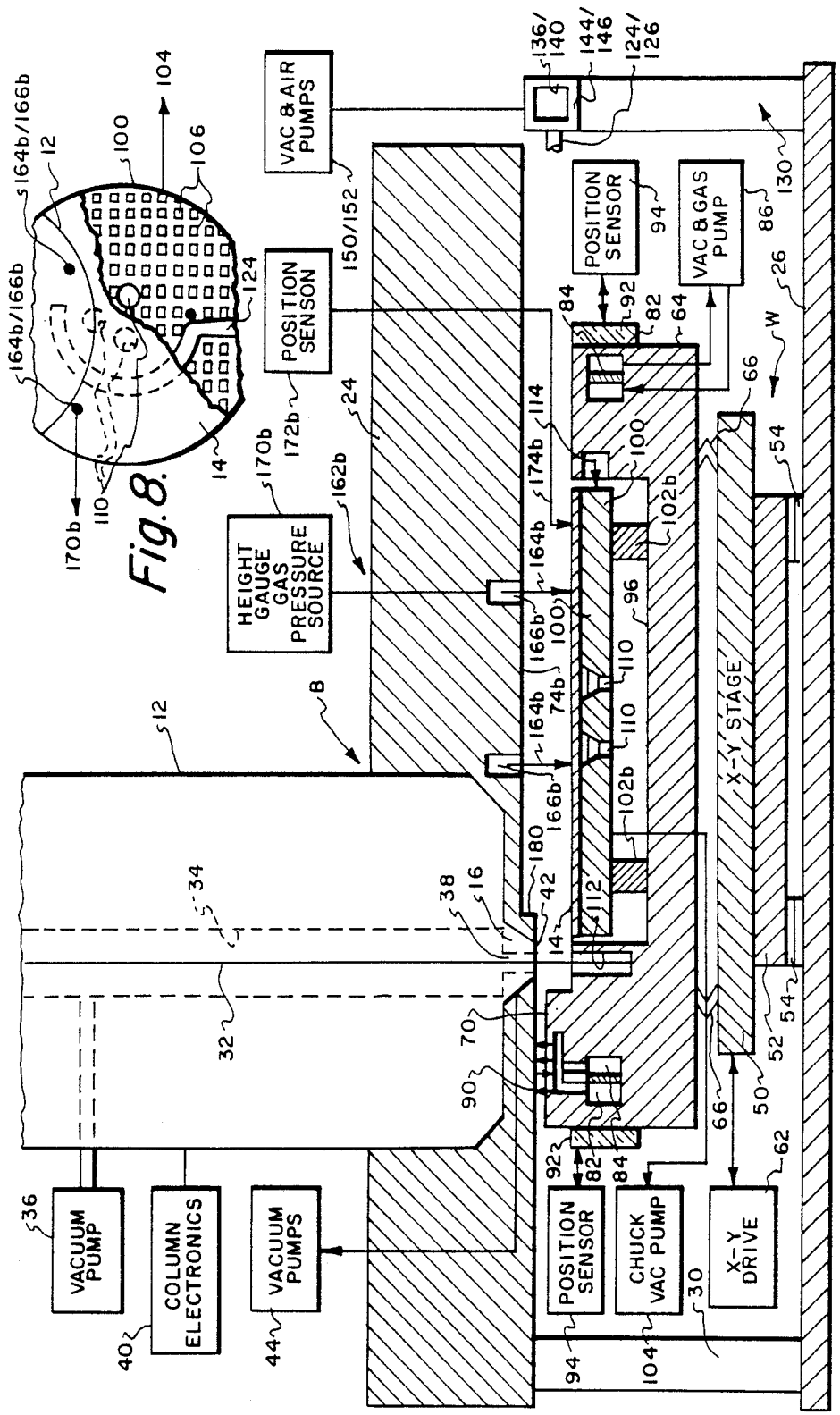

APPARATUS FOR PRESELECTING AND MAINTAINING A FIXED GAP BETWEEN A WORKPIECE AND A VACUUM SEAL APPARATUS IN PARTICLE BEAM LITHOGRAPHY SYSTEMS

BACKGROUND OF THE INVENTION

1. Related Applications

U.S. patent application of L. Young entitled "Differentially Pumped Seal Apparatus" Ser. No. 062,038 06/15/87.

U.S. patent application of L. Young and G. Howard entitled "A Guard Ring For A Differentially Pumped Seal Apparatus" Ser. No. 103,883 filed 10/15/87.

2. Field of Invention

This invention relates to an improvement in particle beam lithography systems for processing a workpiece, such as a semiconductor wafer or mask, and particularly, to an improvement in such systems by providing such systems with a means for preselecting a gap size between the tip of a vacuum seal apparatus and the surface of the workpiece and maintaining this gap fixed during workpiece processing.

3. Prior Art

U.S. Pat. No. 4,524,261 to Petric et al entitled "Localized Vacuum Processing Apparatus" (hereinafter referred to as the '261 patent) and U.S. Pat. No. 4,528,451 to Petric et al entitled "Gap Control System For Localized Vacuum Processing" (hereinafter referred to as the '451 patent).

The '261 patent discloses a localized vacuum seal apparatus, hereinafter called simply a seal apparatus, which provides a non-contacting graded vacuum seal between the seal apparatus and a workpiece to achieve a relatively high vacuum zone in close proximity to the beam of a particle beam lithography system while the remainder of the workpiece remained at ambient pressure as the workpiece is moved in an X-Y direction for processing the entire workpiece. The space between the tip of the seal apparatus and the surface of the workpiece is referred to as a gap.

The U.S. patent application of L. Young Ser. No. 062,038 discloses and claims an improvement over the seal apparatus of the '261 patent in that the Young seal apparatus obtains higher vacuum and a smaller gap between the seal apparatus and the workpiece.

The U.S. patent application of L. Young and G. Howard Ser. No. 103,883 discloses and claims a guard ring of pressurized gas surrounding the seal apparatus to reduce the possibility of contamination coming in contact with the workpiece surface and entering the beam column.

In the '451 patent, it was felt necessary to dynamically control the size of the gap during workpiece processing and thus apparatus for sensing and controlling the gap is disclosed. Specifically, a capacitor sensing device is used to sense the size of the gap and feed this information back to a control and drive mechanism to vary the vertical direction (Z axis) of the workpiece relative to the seal apparatus. The sensing and control is a continuous operation and the gap size is varied within a selected range during workpiece processing.

This invention improves this prior art as disclosed in the '451 patent by providing a means by which a workpiece is held at a predetermined gap size during the processing of the workpiece. This overcomes problems involved in dynamically controlling a variable gap and eliminates the gap size sensors and feedback and drive mechanisms.

SUMMARY OF THE INVENTION

According to the present invention, at a workpiece loading and unloading position, to one side of the beam and beam column of a particle beam lithography system, a workpiece to be processed, is placed on a vacuum chuck to eliminate any irregularity or warpage of the workpiece. At this same position, the workpiece is oriented by gap setting means and fixed at a preselected distance from a standard. This distance correlates with a preselected gap size. The workpiece and chuck are then moved beneath the seal apparatus and beam column for workpiece processing. After processing, the workpiece and chuck are returned to the loading/unloading position to be removed from the lithography system. An interface plate, holding the workpiece and chuck, is maintained in a precise fixed relationship with the standard and the seal apparatus by gas bearings during workpiece processing as well as during loading and unloading of the workpiece. This also maintains the gap at a fixed size during workpiece processing. The interface plate is moved to and from the loading/unloading position to the workpiece processing position by an X-Y stage and a workpiece transport system is provided to transport the workpieces to and from the lithography system and to and from appropriate workpiece cassettes.

From the foregoing, it can be seen that a primary object of this invention is to improve a particle beam lithography system by providing the system with a fixed gap technique thus simplifying the X-Y stage mechanical hardware as well as the system electronics and software.

Still another object of this invention is to improve a particle beam lithography system by the use of gas bearings to position the X-Y stage during workpiece loading/unloading and processing.

Still another object is to improve a particle beam lithography system by providing a means by which a workpiece is positioned relative to a standard by gap setting means so that there is a preselected fixed gap between a seal apparatus and the workpiece during processing by the particle beam.

Still another object of this invention is to provide an improved method and apparatus of loading and unloading a workpiece for processing in a particle beam lithography system.

These and other objects of the invention will be apparent to those skilled in the art after having studied the accompanying drawings and the detailed description hereinafter.

BRIEF DESCRIPTION OF THE DRAWINGS

FIG. 2 is a schematic illustration, like FIG. 1, but illustrating the workpiece in a loading/unloading position to be precisely oriented and fixed relative to a standard by gap setting means; one version of the gap setting means being shown in this figure.

FIG. 3 is a partial illustration of a chuck, an interface plate and of one type of clamping means.

FIG. 7 is a schematic illustration, like FIG. 2, showing the workpiece in the loading/unloading position, but showing another version of the gap setting means, and FIG. 8 is a partial plan view of the chuck and workpiece showing the gas jets arranged in a triangle in this latter version of the gap setting means.

DETAILED DESCRIPTION OF THE INVENTION

Figure 1:
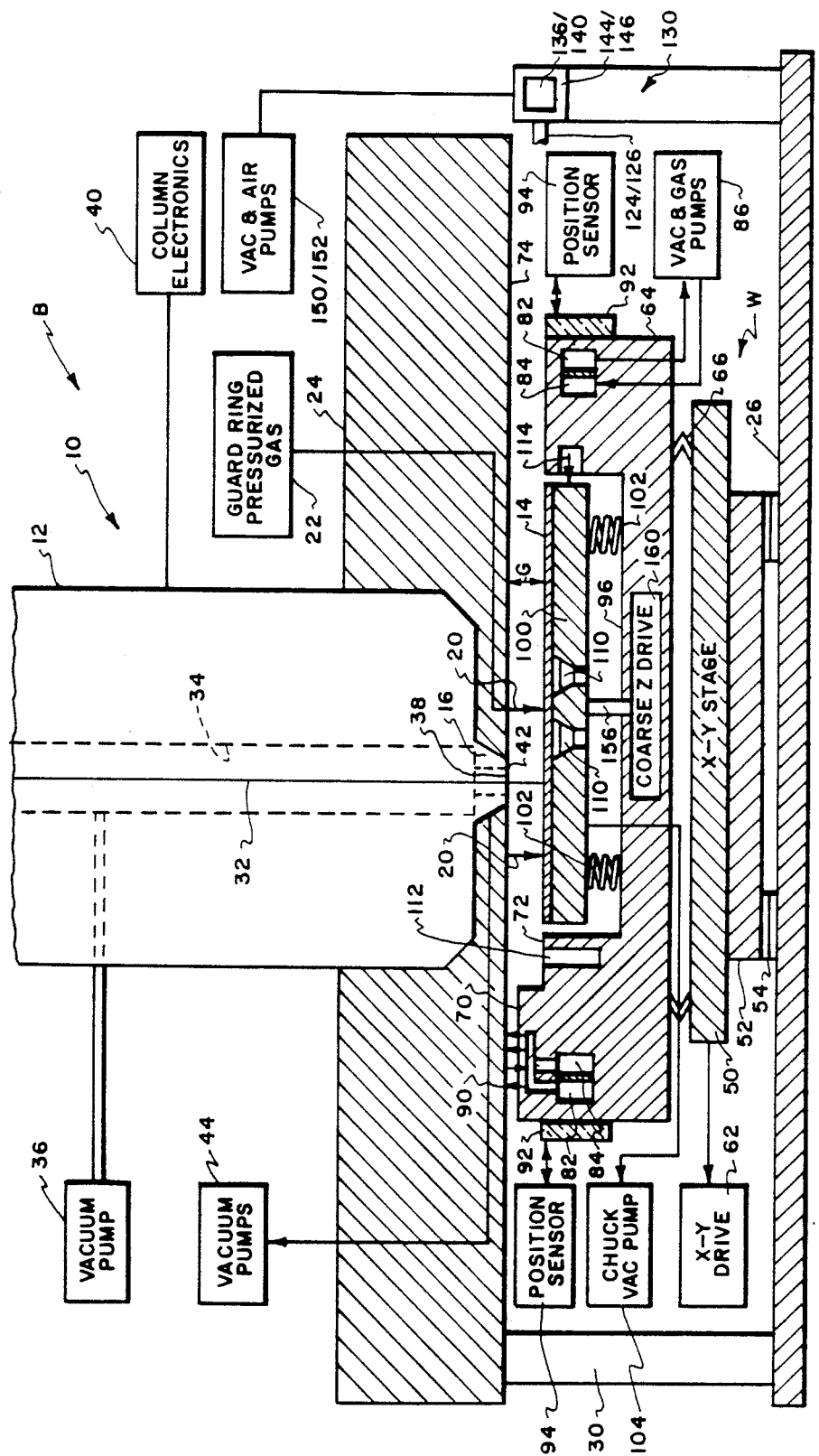
FIG. 1 is a schematic illustration of a particle beam lithography system incorporating apparatus of the present invention and illustrates the workpiece in a position to be treated by the particle beam.

To enable a clear understanding of the drawings and description herein at the outset, it is pointed out that there are essentially two parts to the disclosed particle beam lithography system of this invention, identified in its entirety as 10. These two parts are called a stationary beam part and a movable work holding part, simply for identification and denoted, respectively, as B and W. The stationary beam part B includes a particle beam column 12 and its associated apparatus, and the movable workholding part W includes apparatus on which the workpiece 14 is loaded, processed and unloaded. The workpiece 14 is a semiconductor wafer or mask and is referred to as a substrate or simply a wafer.

The beam part B, in addition to the beam column 12, includes a seal apparatus 16 located at the output of the beam column 12 and may also include a guard ring 20, shown as arrows, surrounding the seal apparatus 16 and connected to a pressure pump 22. The seal apparatus 16 and guard ring 20 are formed in a large plate 24, called a manifold, on which the beam column 12 is mounted. The manifold 24 is supported on a base 26 by posts 30 (only one shown in FIG. 1) and thus is stationary and at a fixed distance from the base 26.

The beam column 12 includes an electron or ionized particle source, demagnification optics and projection and deflection optics which generate a finely focused beam 32 and may also include illumination and shaping optics when a shaped beam is utilized. A central tube 34 (shown in phantom) is within the column 12 and is traversed by the beam 32 and maintained at a high vacuum by a high vacuum pump 36 coupled to the column 12. The beam 32 passes through an aperture 38 in the seal apparatus 16 and impinges on the workpiece 14. The complete lithography system 10 further includes a computer (controller) and associated electronics which controls the beam, the drive system, the vacuum system, the workholding system and stores pattern data and provides beam control signals; all identified by a block diagram 40.

The seal apparatus 16 includes a plurality of conically shaped sleeves forming concentric apertures (one shown as the central aperture 38) which terminate in a generally planar tip 42 positioned, during processing, a distance slightly above the workpiece 14, which distance is the aforementioned gap, identified as G, and is important to the operation of the seal apparatus 16 and the graded seal obtained thereby. The apertures are coupled to first, second and third stage pumps, identified only as a block diagram 44, which gradually reduce the pressure from ambient to a high vacuum level at the central aperture 38 corresponding to the vacuum in the central tube 34. The beam 32 is scanned over the region of the workpiece within the central aperture 38 as the workpiece 14 moves horizontally relative to the seal apparatus 16 while the remainder of the workpiece 14 is at ambient pressure.

The seal apparatus 16 which accomplishes a better reduction in vacuum and a smaller gap size, i.e., about 10 to 15 microns, than that of the prior art seal apparatus of the '261 patent is the preferred seal apparatus to be used and, if more detailed information concerning the preferred seal apparatus is necessary, reference is made to the Young application, supra.

Since air at ambient pressure is reduced to a high vacuum level at the central aperture 38, there is a possibility of contaminants in the atmosphere and/or on the workpiece 14 being sucked into the central aperture and beam column 12. To reduce, or avoid this possibility, the guard ring 20 is preferably incorporated into the particle beam lithography system 10. This guard ring 20 is a ring of pressurized gas surrounding the seal apparatus 16 and impinging on the workpiece 14 and may be filtered dry air or gas, or an inert or ionized gas; all of which may be preheated. If more detailed information concerning this guard ring 20 is necessary, reference is made to the Young and Howard application, supra.

The workholding movable part W of the particle beam lithography system includes a conventional X-Y stage 50 with a stationary plate 52 supported on the base 26 by leveling jacks 54 which are used to initially level the X-Y stage 50 relative to the manifold 24. The X-Y stage 50 is driven in the X-Y direction by a conventional X-Y drive, identified by the block diagram 62.

Figure 6:
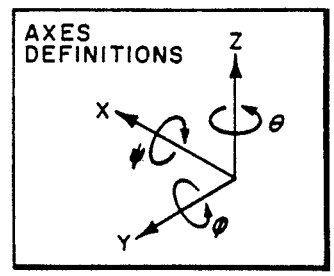
FIG. 6 is an illustration of axes definitions as used herein.

An interface plate 64, movable by the X-Y stage, is supported on the top of the stage 50 by a kinematic mount 66 normally stiff in the X, Y, and $\theta$ direction, but soft and biased in the Z direction. FIG. 6 illustrates the axes definitions as mentioned above.

Figure 4:
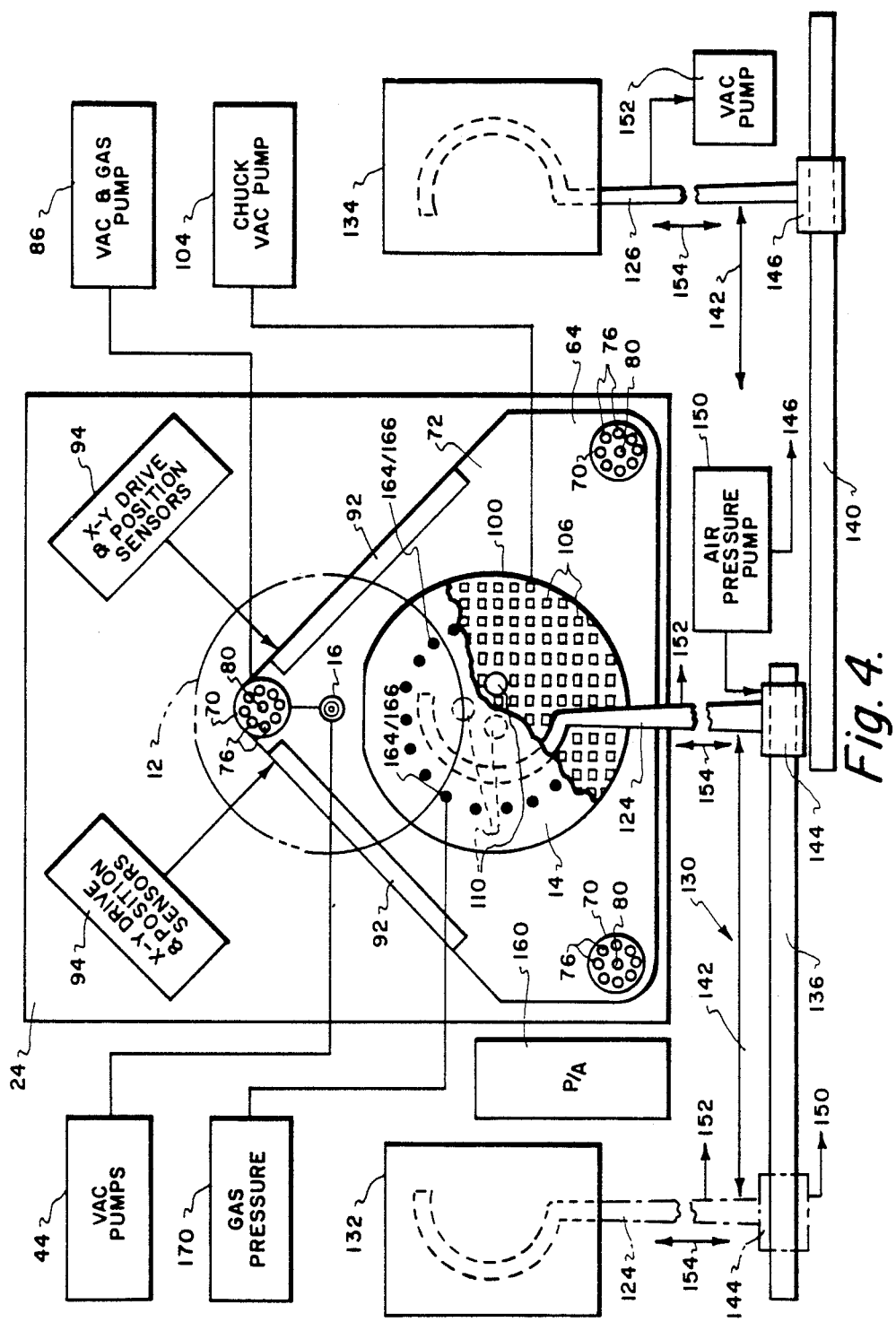
FIG. 4 is a plan view of the particle beam lithography system showing the position of the workpiece and beam column when the workpiece is in the loading/unloading position, showing apparatus for transporting a workpiece to and from the particle beam lithography system, and also showing the gap setting means of FIG. 2.

The interface plate 64 is provided with three gas bearing pads 70 which extend above the top surface 72 of the interface plate 64 and are triangulated, as more clearly shown in FIG. 4, to stabilize the interface plate 64 relative to the bottom 74 of the manifold 24. As also shown in FIG. 4, each pad 70 has a plurality of ports 76, shown arranged in a circle, for pressurized gas and a central port 80 for a vacuum return. Other arrangements of the ports 76 and 80 are feasible; the circular arrangement being by way of example. Gas ports 76 and vacuum return ports 80 are connected, via inner channels 82 and 84, to vacuum and gas pumps, shown as a block diagram 86, to form a film of gas, i.e., a gas bearing, shown as arrows 90 between the manifold bottom 74 and each pad 70 thereby spacing the pads 70 at a predetermined distance of about 2 to 3 microns from the manifold bottom 74. This film of gas continually reacts against the kinematic mount 66.

The interface plate 64 is also provided with mirrors 92 forming part of a position sensing system, identified by block diagrams 94, which are conventionally interferometers, to sense a position of the interface plate 64 and the X-Y stage 50 and feedback position information to the X-Y drive 50 under the control of the lithography system electronics.

The interface plate 64 has a central recess 96 in which a vacuum chuck 100 is supported by soft springs 102 biased in the Z direction. The vacuum chuck 100 is connected to a vacuum pump 104 to provide the vacuum for holding the workpiece flat against the chuck surface to eliminate any irregularity or warpage in the workpiece 14. Chuck 100 has an inner vacuum chamber (not shown) for connecting the vacuum pump 104 to a plurality of apertures 106 formed in the top of the chuck 100, as shown in FIG. 4, where a portion of a workpiece 14 is broken away. Also shown in this figure, and in the other figures, are three centrally located lifters 110 arranged in a triangle to assist in loading and unloading the workpiece 14 on the vacuum chuck 100. This chuck 100 is conventional and is used in other workpiece processing systems.

The interface plate 64 also contains a fiducial cup and grid 112, and a plurality of clamping means 114, shown as arrows in FIGS. 1 and 2, to fix the chuck 100 and the workpiece 14 at the desired position, preferably as coplanar as possible to the top surface 72 of the interface plate 64.

FIG. 3 illustrates one embodiment of the clamping means 114. The chuck 100 is provided with a plurality of radially outwardly extending tabs 116 (only one shown) which extend into slots 120 in the interface plate 64 where suitable clamps, such as pins 122, will engage or disengage the tabs 116 to clamp or release the chuck 100 at the appropriate time. As shown, one side of the tab 116 touches one side of the slot 120 to minimize the motion imparted to the chuck by the clamping action. Ideally, the clamping action should impart no motion to the chuck.

FIG. 1 illustrates the workpiece 14 in position to be processed by the beam 32 as the workpiece 14 is translated in the X-Y direction beneath the beam 32 by the X-Y stage 50 in the conventional manner.

As mentioned above, in this system, the gas bearing films 90 maintain the pads 70 at the predetermined distance from the manifold bottom 74 and, in turn, maintain the workpiece 14 at a predetermined fixed distance (gap G) from the planar tip 42 of the seal apparatus 16. This gap G, being fixed at a preselected size during workpiece processing, distinguishes this invention from the prior art variable gap system as shown in the '451 patent.

As shown in FIGS. 2 and 4, the interface plate 64 has been moved to one side of the beam column 12 by the X-Y stage 50 so that the fiducial cup and grid 112 are directly beneath the particle beam 32 in its neutral position and, of course, the gas bearing films 90 continue to maintain the interface plate 64 at the predetermined distance from the manifold bottom 74. This is the workpiece loading/unloading position and is shown to be at the right of the beam column 12 in FIG. 2 and below the beam column 12 in FIG. 4.

FIG. 4 shows two vacuum wands 124 and 126 of a workpiece transport system 130. Wand 124 is shown in two positions; one extending into a cassette 132 and the other extending over the vacuum chuck 100 and beneath the workpiece 14 simply to show how the wands operate. Wand 124 transports unprocessed workpieces 14 to the lithography system 10 from a cassette 132, shown to the left of the lithography system in FIG. 4, while the other wand 126 transports the processed workpieces from the lithography system to the cassette 134 shown to the right of the lithography system. As can also be seen in FIG. 4, the transport system 130 includes air bars 136 and 140 on which the wands 124 and 126 move horizontally as represented by arrows 142. Suitable means, such as magnet and coil assemblies (not shown) inside the bars 136 and 140 move the wands horizontally on the air bars. Air bearing sleeve blocks 144 and 146 surround air bars 136 and 144 and are connected to an air pressure pump 150 to provide the necessary air under pressure to form air bearings for sliding movement of the wands. The wands 124 and 126 are connected to a vacuum pump 152 to provide the necessary vacuum for lifting and carrying workpieces 14 to and from the cassettes 132 and 134 and to and from the loading/unloading workpiece position. Wands 124 and 126 are also capable of moving normal to the air bars 136 and 140 while loading and unloading workpieces as represented by arrows 154. In practice, the air bars 136 and 140 would be positioned further from the lithography system 10 than shown for proper clearance of the wands and air bearing pads 70. The position shown in FIG. 4 was dictated by drawing size constraints. Also, other variations of the wands are possible, for example, the workpiece lifting portion of the wands may also be capable of rotating horizontally to position the workpieces on the chuck and remove the same after processing.

Thus, during operation of the workpiece transport system 130, by suitable activation of the vacuum in wand 124, an unprocessed workpiece 14 is removed from cassette 132 and placed on a prealigner 160 where the unprocessed workpiece is oriented in the $\theta$ direction and its center determined for later positioning on the vacuum chuck 100. Reference is made to the U.S. patent of Quinn U.S. Pat. No. 4,425,075 entitled "Wafer Aligner" as an example of workpiece aligners. This patent also shows vacuum arms for lifting and positioning the workpieces.

After orientation, the wand 124 is again activated to lift the oriented unprocessed workpiece and move it over the chuck 100 as shown in FIG. 4. If a processed workpiece had been on the chuck 100, it would have been removed by the wand 126 and placed in the cassette 134.

FIGS. 5a–5g show the steps involved in unloading and loading and orienting the workpiece 14 relative to the bottom of the manifold bottom 74 to preselect and fix the gap size. FIG. 4 should also be considered a connection with the steps of FIGS. 5a–5g since the latter are done when the interface plate 64 is in the loading/unloading position of FIG. 4.

Figure 5A:
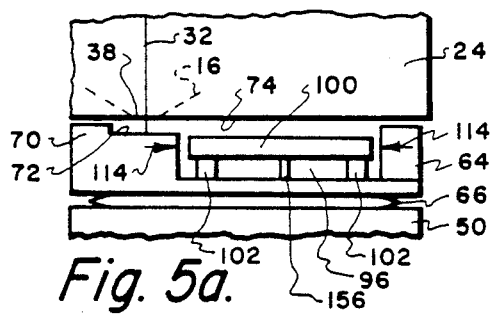
FIGS. 5a–5g are partial cross-sectional schematic views showing the steps involved in loading, unloading and orienting a workpiece relative to the interface plate.

FIG. 5a shows the vacuum chuck 100 without a workpiece 14 and with clamping means 114 disengaged as represented by the arrows spaced from the chuck. The chuck 100 is in its uppermost position and a chuck retracting means 156 is shown schematically activated by being in contact with the bottom of the chuck. At this time, the vacuum to the chuck 100 is turned off. The chuck retracting means 156 may take any suitable form. A hook, releasably connectable to the bottom of the chuck and to a motor means (block diagram 160 in FIGS. 1 and 2) which move the chuck rapidly, is one suitable form of such a device.

Figure 5B:
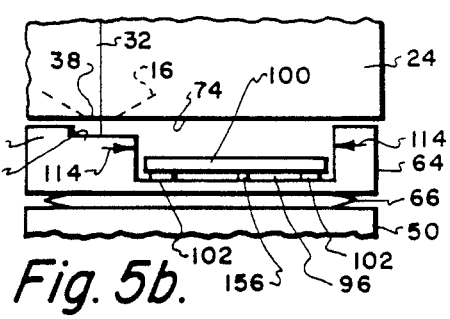

FIG. 5b shows the next step prior to loading an unprocessed workpiece 14 onto the chuck 100. The clamping means 114 is still disengaged, allowing the chuck retracting means 156 to lower the chuck against the springs 102 so that there is sufficient space beneath the manifold bottom 74 to allow the wand 124 to position a workpiece on the chuck. The chuck retracting means 156 is still engaged to the chuck 100 but shown shorter to schematically illustrate its operation. The vacuum to the chuck is still turned off.

Figure 5C:
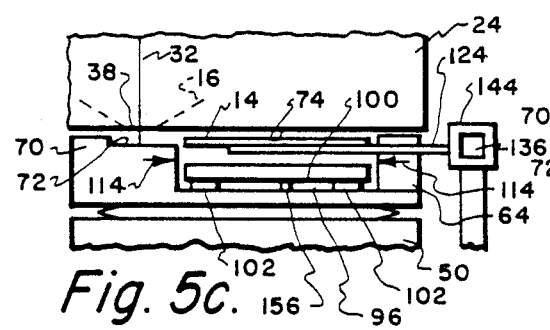

FIG. 5c shows the wand 124 and its workpiece 14 positioned over the chuck 100 with the chuck still in its lowermost position and the clamping means 114 still disengaged.

Figure 5D:
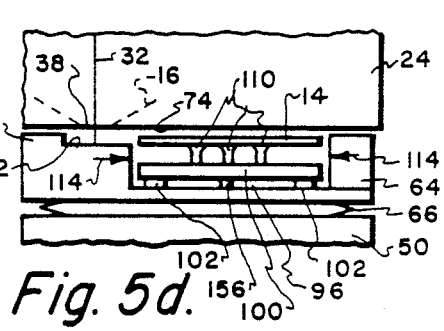

FIG. 5d shows the lifters 110 raised to engage the under surface of the workpiece. When this step takes place, the wand 124 is removed. The chuck 100 is still in its lowermost position and the clamping means 114 is still disengaged.

Figure 5E:
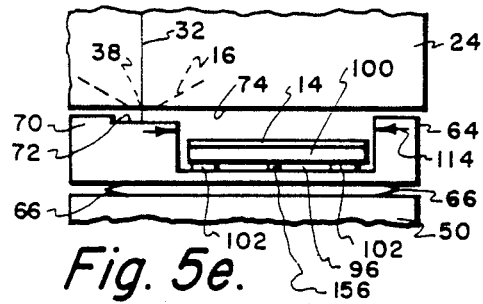

FIG. 5e shows the workpiece resting on the top of the vacuum chuck 100 by the retraction of the lifters 110. The vacuum chuck is still in its lowermost position and the clamping means 114 still disengaged. At this time, the vacuum to the vacuum chuck will be turned on to hold the workpiece flat on the chuck.

Figure 5F:
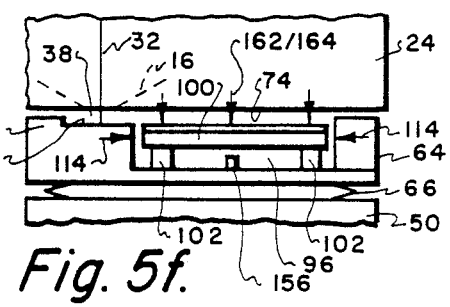

FIG. 5f shows the workpiece and vacuum chuck raised but the clamping means 114 still disengaged. The chuck retracting means 156 was disengaged, as schematically represented by the disconnection thereof from the chuck, allowing the springs 102 to raise the chuck to the position shown. At this time, a gap setting means 162 is activated. FIGS. 2 and 4 show the preferred version of the gap setting means 162. This gap setting means 162 comprises a plurality of gas jets represented by arrows 164 impinging on the workpiece from a plurality of passages 166 (only one shown in FIG. 2) which are connected to a source of pressurized gas 170. These passages 164 are shown arranged in a circle in FIG. 4 as one example of their arrangement. This orients the workpiece at a fixed gap parallel to the standard (manifold bottom 74).

Finally, with the workpiece and chuck properly oriented and spaced, the clamping means 114 is activated to engage and hold the chuck and workpiece in position as represented by the arrows touching the chuck. The gas to the gas jets is turned off.

Next, the interface plate 64 will be moved beneath the beam column 12 for workpiece processing in a conventional manner.

As mentioned above, FIGS. 2 and 4 show the preferred embodiment of this invention in which the gap setting means 162 creates a gas film between the manifold bottom 74 and the workpiece thereby spacing the workpiece from the manifold bottom by a predetermined amount. The film is schematically represented by the horizontal component arrows 164a. A suitable sensor, such as an optical sensor, represented by block diagram 172 and arrow 174, is then activated to determine if the spacing between the manifold bottom and the workpiece is correct. If the spacing is correct, the interface plate 64 will then be transported beneath the beam column for processing the workpiece as stated above. On the other hand, if the signal from the sensor, as represented by block diagram 172 and arrow 174, indicates that the spacing is not correct, the clamping means 114 are disengaged and the process of orienting the workpiece by the gap setting means is repeated until the spacing is correct. After the correct spacing is achieved and the chuck is clamped, the pressurized gas is turned off.

FIGS. 7 and 8 show another embodiment of this invention wherein the gap setting means 162b (the second version of the gap setting means) comprises three height gauge gas jets 164b which direct pressurized gas onto workpiece 14. The workpiece 14 is moved in the Z direction by piezoelectric drive means 102b which provide a fine Z adjustment. These gas jets 164b are arranged in a triangle and are connected to a gas pressure source 170b through passages 166b. These gas jets 164b and fine Z adjustment means 102b function similar to the gas jets and fine Z adjustment means in other semiconductor aligning devices and are provided with pneumatic, optical or capacitative type sensing devices, denoted as block diagram 172b and arrow 174b, which determine the correct spacing between the workpiece 14 and the manifold 24.

Since this type of gas jets 164b require more space between the manifold 24 and the workpiece 14, the bottom of the manifold 24 is provided with a cut-away portion by an amount shown by ledge 180. To distinguish this manifold bottom from the manifold bottom 74 of the prior embodiment, this manifold bottom, as cut-away, which is also a standard as in the prior embodiment, is denoted as 74b. However, the concept of fixing and maintaining the gap G is the same as in the prior embodiment since the depth of the cut-away portion is a known quantity relative to the workpiece.

Figure 5G:
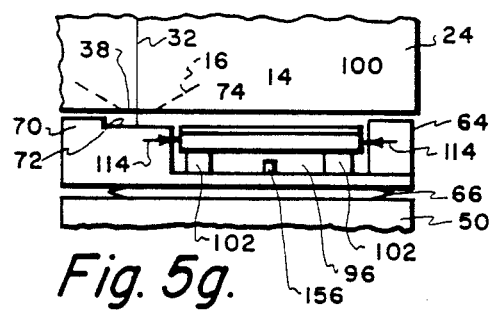

During the loading process only, the sensors, as represented by the block diagram 172b and arrow 174b, are dynamic and monitor the space between the workpiece 14 and the manifold bottom 74b until the workpiece 14 is correctly positioned, at which time the clamping means 114 are activated as in FIGS. 5f and 5g and the pressurized gas turned off so that the interference plate 64 may be moved beneath the column 12 where the workpiece 14 may be processed.

It should be apparent in the embodiments of FIGS. 7 and 8 that those components which have the same functions as in the prior embodiment have been given the same reference numerals and those components which provide similar functions as in the prior embodiments have been given the same reference numerals but with a suffix b. This simplifies and shortens the description of the components in these latter figures. Note that the workpiece is loaded/unloaded within the cut-away portion 74b of the manifold and, in this embodiment, the wands 124 and 126 are positioned higher relative to the base 26 than in the prior embodiment. Also, it should be apparent that the coarse Z adjustment means 150 and 156, as well as the springs 102, have been eliminated in the embodiment of FIGS. 7 and 8 and, therefore, these components as steps in adjusting the gap G in FIGS. 5a-5g are eliminated but the other steps in establishing the gap in this latter embodiment remain the same.

We claim:

1. In a particle beam lithography system for treating a semiconductor wafer or mask including a particle beam source and means for generating and directing a particle beam through an aperture as a treating beam for said workpiece surface, said aperture forming part of a means for maintaining only a portion of the surface of said workpiece in a vacuum, the improvement comprising;

means for determining the orientation and position of said workpiece surface relative to and spaced from said aperture including, plate means on an X-Y stage maintained at a predetermined distance from said aperture, chuck means in said plate means for holding said workpiece and capable of being positioned relative to said aperture independently of said plate means, gap setting means, said gap setting means being operative to orient and position said workpiece and said chuck relative to said aperture, and means locking said chuck means in said plate means after being orienting and positioned by said gap setting means, whereby when said workpiece is oriented and positioned in said plate means, said plate means and X-Y stage are continuously maintained relative to said aperture so that the space between said workpiece surface and said aperture is constant regardless of the position of said X-Y stage.

2. The system as claimed in claim 1 wherein said plate means and X-Y stage are maintained at said predetermined distance from said aperture by gas bearings.

3. The system as claimed in claim 2 wherein said plate means is movable to one side of said particle beam and aperture to a loading/unloading position where a workpiece may be loaded and unloaded from said chuck means.

4. The system as claimed in claim 3 wherein said air bearings maintain said plate means and said X-Y stage relative to said aperture in said loading/unloading position.

5. The system as claimed in claim 4 wherein said gap setting means is located over said workpiece while in the loading/unloading position so that said workpiece and chuck are oriented and positioned and ready to be moved to beneath the beam where said beam treats said workpiece.

6. A particle beam lithography system for treating a semiconductor wafer or mask workpiece surface comprising a beam column having means for generating and directing a particle beam toward the workpiece surface,
a seal apparatus for maintaining only a portion of said workpiece surface in a vacuum so that the beam can be directed to that portion in the vacuum while the rest of the workpiece surface is at ambient pressure, and
means for orienting and positioning said workpiece in a fixed relationship with respect to said seal apparatus so that a static gap of a predetermined size is formed between said seal apparatus and workpiece during workpiece processing and so that the workpiece surface can move generally transversely of the beam to enable different portions to be treated by the beam at different times yet maintain said vacuum beneath said seal apparatus,
said last mentioned means including a standard and gap setting means reacting on said workpiece to orient and position said workpiece relative to said standard, and
means for holding and locking said workpiece in position after having been oriented and positioned relative to said standard.

7. The system as claimed in claim 6 wherein said standard and gap setting means are at a remote position relative to said beam column.

8. The system as claimed in claim 7 further including an X-Y stage for moving said oriented and positioned workpiece from said remote position to beneath said beam column so that said beam may treat said workpiece in an X and Y direction while beneath said column.

9. The system as claimed in claim 8 wherein said X-Y stage is capable of returning said processed workpiece to said remote position.

10. The system as claimed in claim 9 wherein said X-Y stage is responsive to gas bearings to maintain said workpiece in said oriented and positioned state.

11. A particle beam lithography system for treating a semiconductor workpiece such as a wafer or mask comprising:
beam apparatus and workholding apparatus,
said beam apparatus including;
a beam column and means for generating and directing a particle beam onto said workpiece,
seal apparatus having an aperture through which said beam is directed and deflected for treating said workpiece for maintaining the area of said workpiece beneath said aperture in vacuum,
a manifold supporting said beam apparatus and having a surface fixed relative to said workholding apparatus, and
said workholding apparatus including,
an X-Y stage,
chuck means for holding said workpiece at a predetermined distance relative to said aperture thus forming a gap therebetween,
chuck holding means supported on and responsive to said X-Y stage to translate said workpiece and chuck in an X and Y direction while said beam is treating said workpiece,
said chuck holding means being biased toward said manifold surface, and
gas bearing means on said chuck holding means directing gas under pressure toward said manifold surface and opposing said bias to maintain said chuck holding means a predetermined distance from said manifold surface as said workpiece is translated in said X and Y direction.

12. The system as claimed in claim 11 including a first position where said workpiece is to be treated by said beam and a second position where said workpiece is capable of being loaded on or unloaded from said chuck means,
said chuck holding means being translatable by said X-Y stage between said first and second positions,
said gas bearing means operative to maintain said chuck holding means said predetermined distance from said manifold surface in both said first and second positions.

13. The system as claimed in claim 12 wherein said beam apparatus further includes gap setting means for directing gas under pressure on an untreated workpiece when loaded onto said chuck means to orient and space said workpiece relative to said manifold surface, said space being correlated to the desired size of said gap, and
means for fixing said workpiece at the orientation and space as determined by said gap setting means so that said workpiece is held fixed relative to said manifold and said gap remains fixed continuously as said chuck holding means and workpiece are translated to said first position and translated thereat by said X-Y stage so that said workpiece may be treated by said beam beneath said aperture.

14. A method of orienting a workpiece surface in a particle beam apparatus in which the particle beam is directed through an aperture in vacuum on a portion of said surface approximate said aperture comprising the steps of:
moving workholder apparatus laterally to one side of said aperture while said workholder apparatus is continuously oriented relative to said aperture by gas bearing means,
placing a workpiece in a chuck in said workholder apparatus and impinging gas from gap setting means on said workpiece to orient said workpiece and chuck relative to said workholder apparatus and to a predetermined standard, locking said chuck in said workholder apparatus according to said orientation determined by said gap setting means, and moving said workpiece laterally proximate said aperture for treating said workpiece in accordance with a predetermined pattern while said workholder apparatus is maintained relative to said aperture by said gas bearing means.

* * * * *